United States Patent [19]

Konuma

[11] Patent Number: 5,576,562
[45] Date of Patent: Nov. 19, 1996

[54] SOLID-STATE IMAGING DEVICE

[75] Inventor: Kazuo Konuma, Tokyo, Japan

[73] Assignee: NEC Corporation, Tokyo, Japan

[21] Appl. No.: 463,357

[22] Filed: Jun. 5, 1995

[30] Foreign Application Priority Data

Jun. 6, 1994 [JP] Japan .................................. 6-123423

[51] Int. Cl.$^6$ .......................... H01L 27/148; H01L 29/768
[52] U.S. Cl. .......................... 257/232; 257/221; 257/229; 257/233
[58] Field of Search .................................. 257/219, 221, 257/223, 229, 232, 233, 485, 486

[56] References Cited

U.S. PATENT DOCUMENTS 5,379,067  1/1995  Miura ...................................... 348/311

FOREIGN PATENT DOCUMENTS

| 63-110867 | 5/1988 | Japan . |
| 63-147365 | 6/1988 | Japan . |
| 2-2165 | 1/1990 | Japan . |
| 3-139983 | 6/1991 | Japan . |

OTHER PUBLICATIONS

"Construction and performance of a 320 x 244–Element IR–CCD Imager with PtSi Schottky–Barrier Detectors," T. S. Villani et al., SPIE, vol. 1107, Infrared Detectors, Focal Plane Arrays, and Imaging Sensors, 1989, pp. 9–21.

*Primary Examiner*—Ngân V. Ngô
*Attorney, Agent, or Firm*—Popham, Haik, Schnobrich & Kaufman, Ltd.

[57]  ABSTRACT

A solid-state imaging device that enables correction of the shading phenomenon effectively without overall sensitivity reduction. This device contains pixels arranged in an array to form an image area, photodetectors for detecting incident light to generate signal charges, and charge transfer devices for transferring the signal charges generated in the plurality of photodetectors. Each of the pixels contains one of the photodetectors and one of the charge transfer devices. The sensitivity of the photodetectors varies according to placement of the photodetectors in the image area, so that the sensitivity has a distribution that cancels nonuniformity of the incident light in the image area. The sensitivity of the photodetectors is preferably distributed concentrically with the center of the image area.

14 Claims, 8 Drawing Sheets

SOLID-STATE IMAGING DEVICE

BACKGROUND OF THE INVENTION

1. Field of the Invention

The present invention relates to a solid-state imaging device and more particularly, to one- or two-dimensional solid-state imaging device using photodetectors such as photodiodes arranged in a matrix array and charge transfer devices such as charge coupled devices (CCDs) for transferring signal charges generated in the photodetectors.

2. Description of the Prior Art

FIG. 1 schematically shows the structure of a conventional solid-state imaging device, which is termed a CCD image sensor with an interline transfer structure. FIG. 2 shows a plan view of each pixel of this device.

As shown in FIG. 1, this imaging device has a plurality of Schottky-barrier photodiodes 61 arranged in a matrix array, a plurality of transfer gate devices 63 that are provided for the respective photodiodes 61, a plurality of vertical transfer CCDs 62 each of which is arranged vertically along each column of the matrix, a horizontal transfer CCD 64 arranged horizontally along the rows of the matrix, and an output section 65 arranged at an output end of the horizontal transfer CCD 64. The photodiodes 61, the transfer gate devices 63, the vertical transfer CCDs 62, the horizontal transfer CCD 64, and the output section 65 are disposed on or over a silicon (Si) substrate.

The photodiodes 61, the gate devices 63 and the vertical transfer CCDs 62 are disposed in a rectangular image area 60 of the imaging device. The image area 60 is composed of a plurality of square pixels 66 as shown in FIG. 2 arranged in the matrix array. Each of the pixels 66 contains a corresponding one of the photodiodes 61 and a corresponding one of the transfer gate devices 63.

The photodiodes 61 receive incident light to generate and store electrical signal charges according to the intensity of the light, respectively.

The vertical transfer CCDs 62 read out the signal charges stored in the photodiodes 61 of the respective columns through the transfer gate devices 63 in response to a driving signal and then, they transfer vertically the packet of the signal charges to the horizontal transfer CCD 63.

The horizontal transfer CCD 64 transfers successively the packets of the signal charges transferred from the vertical transfer CCDs 62 horizontally to the output section 65.

The output section 65 converts the signal charge packets from the horizontal transfer CCD 64 to a voltage signal to output it.

As shown in FIG. 2, in each pixel 66, the Schottky-barrier photodiode 61 is surrounded by a guard ring 48 formed in the Si substrate. The photodiode 61 has a metal electrode 53 made of platinum silicide (PtSi) formed to be in contact with the substrate. The PtSi photodiode 61 is sensitive to the infrared (IR) light region. The vertical transfer CCD 62 has a channel region 47 that is formed in the substrate and that extends vertically toward the horizontal transfer CCD 64. A gate electrode 54 of the CCD 62, which is formed over the channel region 47, acts as a gate electrode of the transfer gate device 63 also. A gate electrode 55 of the CCD 62, which is formed over the channel region 47, is used for transferring the signal charge read out from the photodiode 61.

The photodiode 61 and the transfer gate device 63 are isolated by a channel stop region 45 from the adjacent photodiodes 61 and the adjacent transfer gate devices 63. The vertical transfer CCD 62 also is isolated by the region 45 from the adjacent CCDs 62. The channel stop region 45 is made by ion-implantation of an n- or p- dopant.

FIG. 3 schematically shows the arrangement of the square pixels 66 in the rectangular image area 60, the length and width of the area 60 being a' and b', respectively. FIG. 4 schematically shows output charge amount and sensitivity characteristics in the image area 60 along the line IV—IV in FIG. 3.

In practical use, the light irradiated from an image is focused by a lens system, and is then introduced into the image area 60. Since the transmission rate of the incident light of the lens system is lower in its periphery than at its center, the shading phenomenon occurs. On the other hand, the photodiodes 61 have substantially the same sensitivity $S_0$. Therefore, under application of the incident light, an obtainable output charge amount becomes maximum at the center X of the image area 60 and decreases monotonously toward the periphery of the area 60, as shown in FIG. 4.

Specifically, the output charge amount changes from $I_1$ at the center of the image area 60 to $I_2$ at the end thereof.

In FIG. 4, $I_d$ denotes a dark current value, and $I_m$ denotes the maximum output charge amount of the device. The maximum output charge amount $I_m$ is equivalent to the maximum transfer charge of the vertical or horizontal transfer CCD 62 or 64.

It is seen from FIG. 4 that the output charge margin $\Delta I$, which relates to the dynamic range, is very small and that the output charge amount $I_2$ at the end of the image area 60 is too low.

Similar problems due to characteristic variation or fluctuation in the image area are found in the other types of solid-state imaging devices. For example, with a metal-oxide-semiconductor (MOS)-type solid-state image sensor, the operating point optimization is prevented by an unwanted fluctuation or distribution of sensitivity in the image area. Also, with a charge swept device (CSD), an obtainable charge transfer efficiency deteriorates drastically at the periphery of the image area.

To reduce these problems or effects due to the shading phenomenon, various measures have been developed and examined. One of the conventional measures utilizes a shading-correction filter attached to a focusing lens system. This filter has an optical transmission characteristic in which the transmission rate is relatively low at its center and relatively high in its periphery. This is an intrinsic measure because the shading phenomenon or effect of the incident light to the image area is prevented.

This measure, however, reduces the intensity of the incident light due to the filter, so that a wider aperture is necessary to the focusing lens system. Since the wider aperture makes the shading effect more serious, the serious shading effect has to be corrected by the filter. Additionally, the correction lens system becomes complex in structure due to the filter.

One of the conventional measures utilizing an improved image area is disclosed in the Japanese Non-Examined Patent Publication No. 63-147365. In this measure, a right receiving face or image area of a solid-state image sensor contains an array of convex microlenses each of which is disposed above each pixel of the image area. The microlens placed at the center of the image area has a curvature relatively smaller than those of the microlenses placed in the periphery of the image area.

Therefore, an obtainable focusing characteristic of the image area becomes relatively lower at the center of the image area than in the periphery thereof due to the array of the microlenses, although the sensitivity of the microlenses should be designed to be maximized at the center of the image area.

With this measure using the microlens array, the focusing characteristic of the image area is relatively lower at the center of the image area than in the periphery thereof, and therefore, the same problem as in the above measure using the correction filter occurs.

Additionally, it is difficult to optimize operation characteristics such as crosstalk because one design parameter is added by the microlens array. The shading correction is not effective for a pixel having a high fill factor. Also, the optimized shape of the microlenses is very difficult to be practically fabricated.

Consequently, in view of the fact that the shading phenomenon seriously affects device operation where a wider aperture lens is provided, the above conventional measures cannot correct effectively the shading phenomenon without overall sensitivity reduction the intensity of the incident light applied to the image area is reduced.

SUMMARY OF THE INVENTION

Accordingly, an object of the present invention is to provide a solid-state imaging device that enables correction of the shading phenomenon effectively without overall sensitivity reduction.

Another object of the present invention is to provide a solid-state imaging device that enables realization of an imaging operation with a superior image quality and a wide dynamic range.

A solid-state imaging device according to the present invention contains a plurality of pixels arranged in an array to form an image area, a plurality of photodetectors for detecting incident light to generate signal charges, and a plurality of charge transfer devices for transferring the signal charges generated in the plurality of photodetectors. Each of the pixels contains one of the photodetectors and one of the charge transfer devices.

The sensitivity of the photodetectors varies according to placement of the photodetectors in the image area, so that the sensitivity has a distribution that cancels nonuniformity of the incident light in the image area.

The sensitivity of the photodetectors is preferably distributed concentrically with the center of the image area. In this case, the sensitivity is preferably distributed to increase dependent on a distance from the center of the image area.

Preferably, the photodetectors are Schottky-barrier photodiodes each of which has metal electrode contacted with a semiconductor material. In this case, an interface of the metal electrode and the semiconductor material is doped with an impurity and its doping concentration varies according to placement of the photodetectors in the image area.

The doping concentration of the impurity preferably varies concentrically with the center of the image area. Also, the doping concentration of the impurity preferably varies to increase dependent on a distance from the center of the image area.

The interface of the metal electrode and the semiconductor material is preferably doped with the impurity by selective ion-implantation.

With the solid-state imaging device according to the present invention, the sensitivity of the photodetectors has a distribution that cancels nonuniformity of the incident light in the image area. Therefore, even if any nonuniformity of the incident light occurs in the image area due to the shading phenomenon, the nonuniformity is cancelled by the distribution of the sensitivities of the photodetectors.

On the other hand, the incident light is not reduced in intensity before the image area.

As a result, the shading phenomenon can be corrected effectively without overall sensitivity reduction of the solid-state imaging device.

Also, since the shading phenomenon is corrected without overall sensitivity reduction of the device, an imaging operation can be realized with a superior image quality and a wide dynamic range.

DETAILED DESCRIPTION OF THE PREFERRED EMBODIMENT

Preferred embodiments of the present invention will be described below referring to FIGS. 5 to 15.

Figure 1:
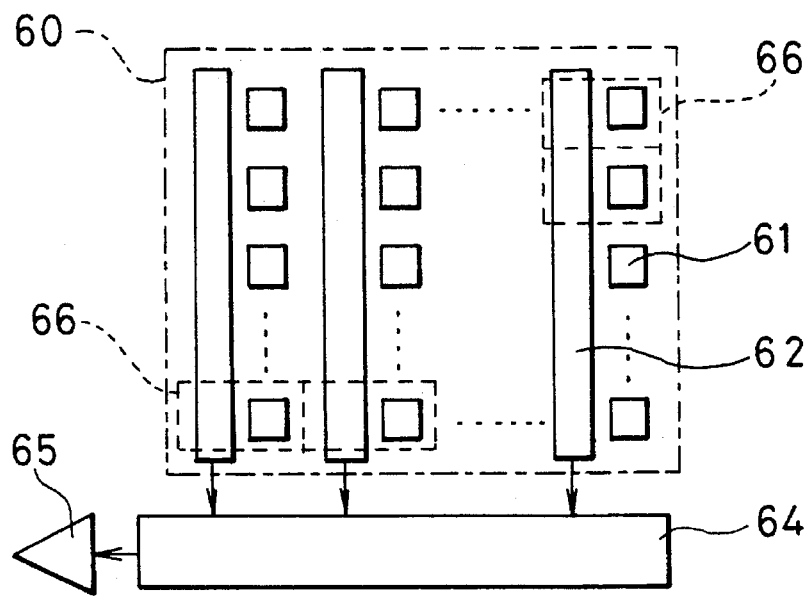
FIG. 1 schematically shows the structure of a conventional solid-state imaging device, which is termed a CCD image sensor with an interline transfer structure.
Figure 2:
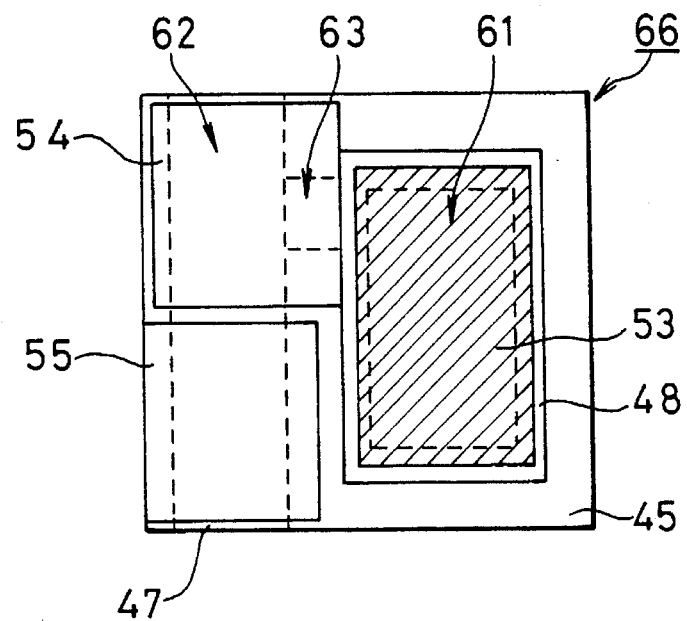
FIG. 2 shows a plan view of each pixel of the conventional solid-state imaging device shown in FIG. 1.
Figure 3:
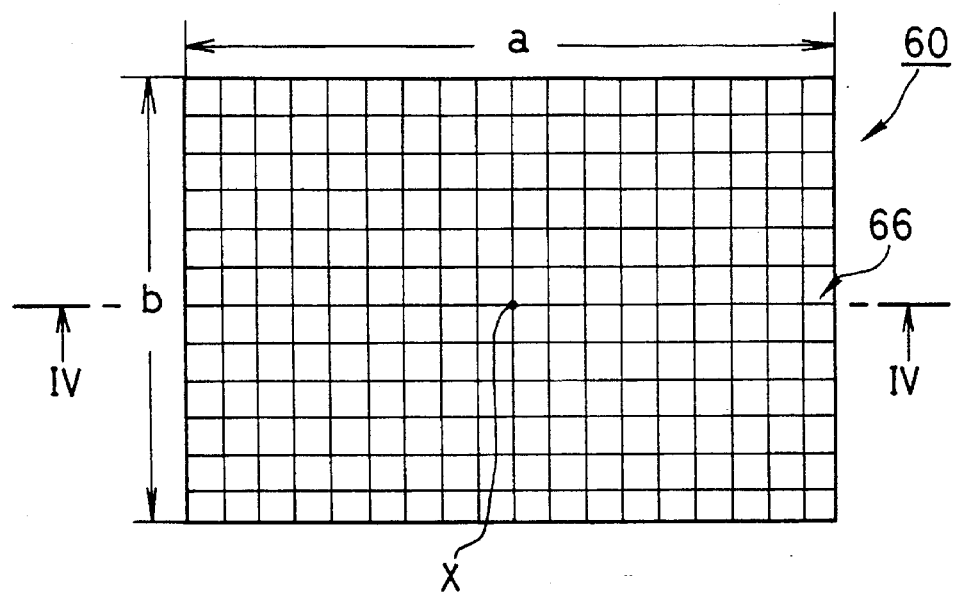
FIG. 3 schematically shows arrangement of pixels in the image area of the conventional solid-state imaging device shown in FIG. 1.
Figure 4:
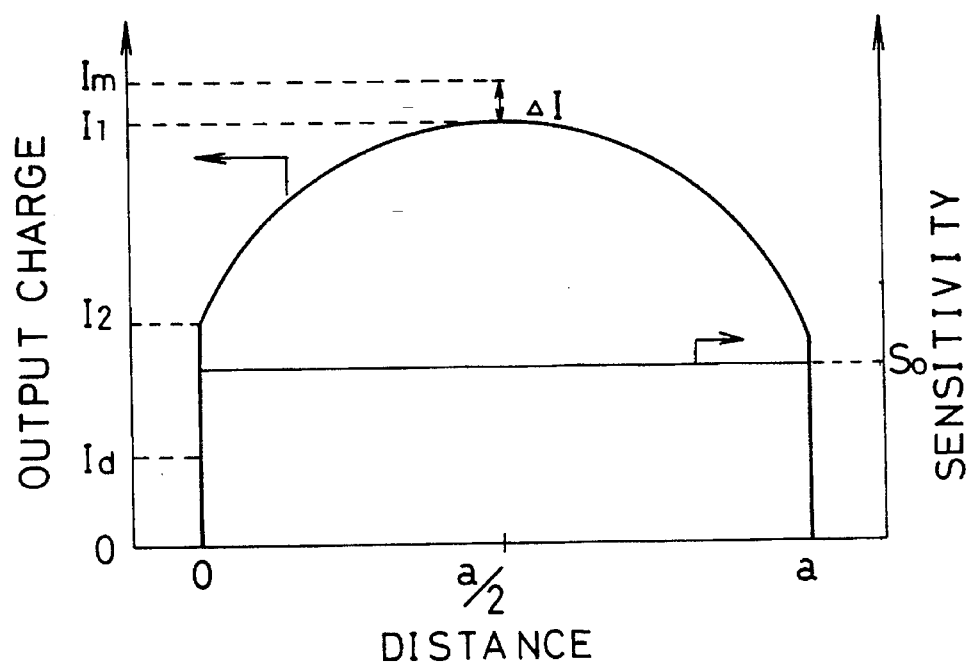
FIG. 4 is a graph showing output charge amount and sensitivity characteristics of the conventional solid-state imaging device of FIG. 1 as a function of a distance from an end of the image area.

Similar to the conventional solid-state imaging device shown in FIG. 1, a solid-state imaging device according to a first embodiment, which is termed an IR CCD image sensor having an interline transfer structure, has a plurality of Schottky-barrier photodiodes 1 arranged in a matrix array, a plurality of transfer gate devices 3 that are provided for the respective photodiodes 1, a plurality of vertical transfer CCDs, in which CCDs are arranged vertically along each column of the matrix, a horizontal transfer CCD (not shown) arranged horizontally along the rows of the matrix, and an output section (not shown) arranged at an output end of the horizontal transfer CCD.

Figure 6:
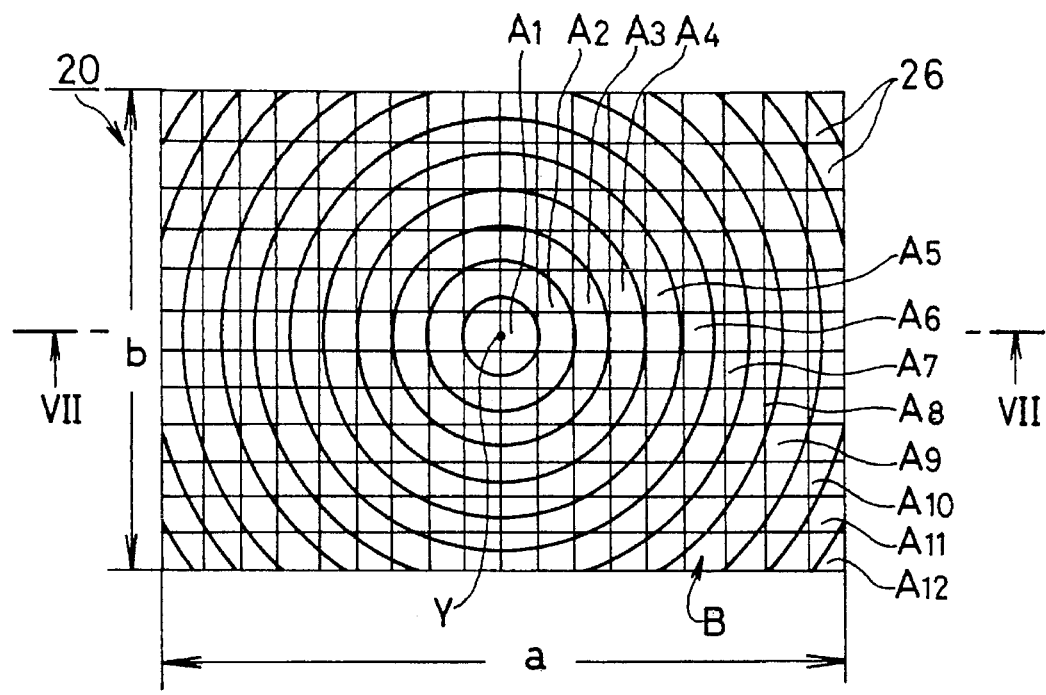
FIG. 6 schematically shows arrangement of pixels in the image area of the solid-state imaging device according to the embodiment, in which the sensitivity distribution of the photodiodes is also illustrated.

As shown in FIG. 6, the photodiodes 1, the transfer gate devices 3 and the vertical transfer CCDs 2 are disposed in a rectangular image area 20 of the imaging device. The image area 20 is composed of a plurality of square pixels 26 arranged in the matrix array. Each of the pixels 26 contains a corresponding one of the photodiodes 1 and a corresponding one of the transfer gate devices 3.

The photodiodes 1 receive incident light to generate and store electrical signal charges according to the intensity of the light, respectively.

The vertical transfer CCDs 2 read out the signal charges stored in the photodiodes 1 of the respective columns through the transfer gate devices 3 in response to a driving signal and then, they transfer vertically the packet of the signal charges to the horizontal transfer CCD.

The horizontal transfer CCD transfers successively the packets of the signal charges transferred from the vertical transfer CCDs 2 horizontally to the output section.

The output section converts the signal charges from the horizontal transfer CCD to a voltage signal to output the signal.

Figure 11A:
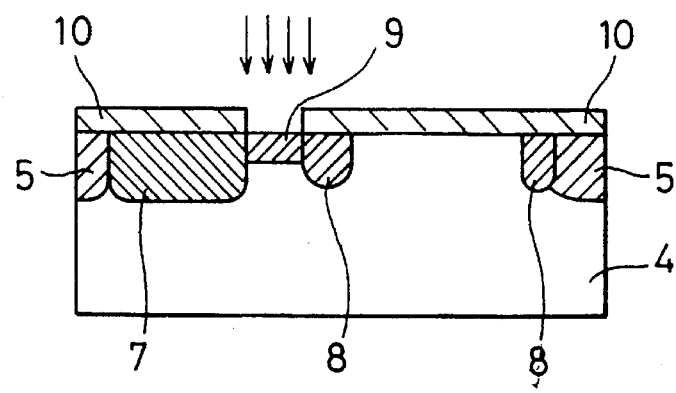
FIGS. 11A to 11C schematically show a fabrication process sequence of the solid-state imaging device according to the embodiment of the invention.
Figure 11B:
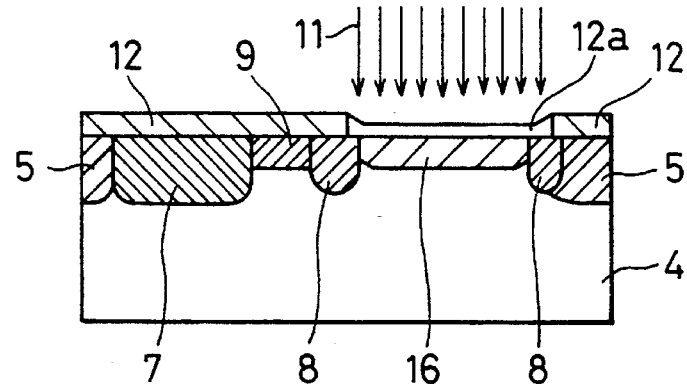
Figure 11C:
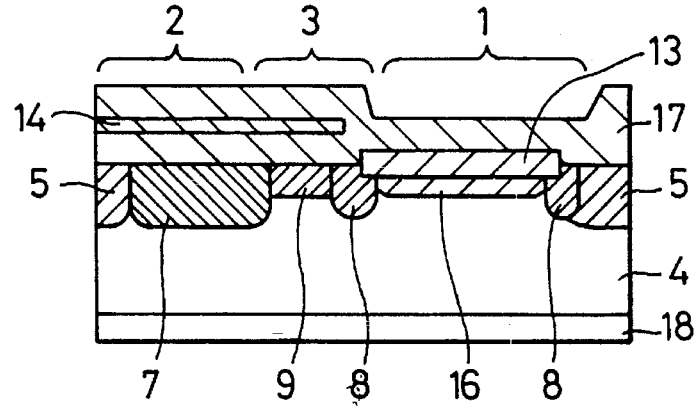

As shown in FIG. 11C, the photodiodes 1, the transfer gate devices 3, the vertical transfer CCDs 2, the horizontal transfer CCD, and the output section are disposed on or over a p-Si substrate 4.

Figure 5:
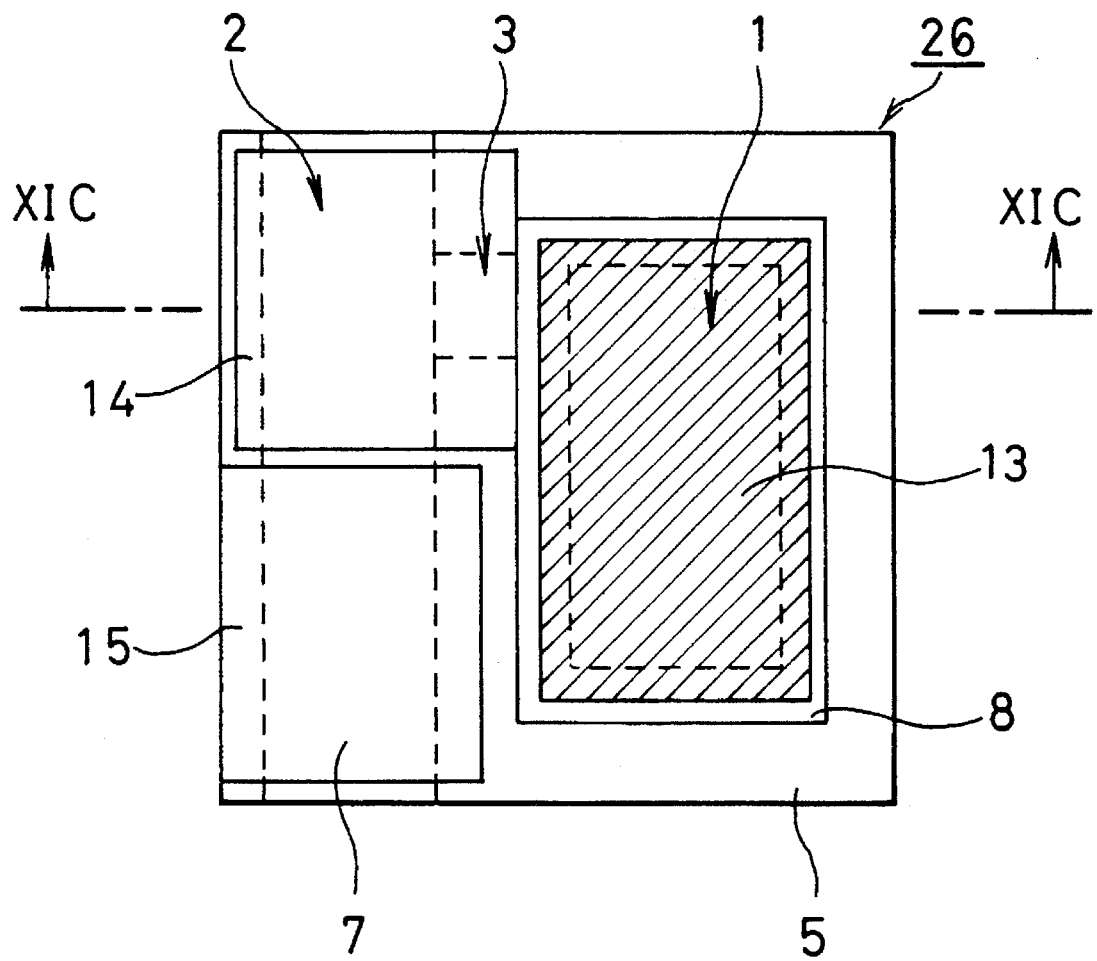
FIG. 5 shows a plan view of each pixel of a solid-state imaging device according to an embodiment of the present invention.

In each pixel 26, as shown in FIGS. 5 and 11C, the Schottky-barrier photodiode 1 is surrounded by a guard ring 8 formed in the substrate 4. The photodiode 1 has a metal electrode 13 made of PtSi formed to be contact with the substrate 4. The PtSi photodiode 1 is sensitive to the IR light region. The vertical transfer CCD 2 has a channel region 7 that is formed in the substrate 4 and that extends vertically toward the horizontal transfer CCD. A gate electrode 14 of the CCD 2, which is formed over the channel region 7, acts as a gate electrode of the transfer gate device 3 also. A gate electrode 15 of the CCD 2, which is also formed over the channel region 7, is used for transferring the signal charge read out from the photodiode 1.

The photodiode 1 and the transfer gate device 3 are isolated by a $p^+$-channel stop region 5 from the adjacent photodiodes 1 and the adjacent transfer gate devices 3. The vertical transfer CCD 2 also is isolated by the region 5 from the adjacent CCDs 2. The channel stop region 5 is made by ion-implantation of boron (B) or the like.

In FIG. 11C, a channel region 9 of the transfer gate device 3 is formed in the substrate 4. An ion-implanted region 16 of the photodiode 1 is formed in the interface of the PtSi electrode 13 and the substrate 4. An insulator film 17 is formed on the substrate 4 to cover the photodiode 1, the vertical transfer CCD 2, and the transfer gate device 3. The gate electrodes 14 and 15 of the CCD 2 are formed in the insulator film 17. An anti-reflection film 18 is formed on the back of the substrate 4.

The arrangement of the square pixels 26 in the rectangular image area 20 is shown in FIG. 6. The length and width of the area 20 are a and b, respectively.

The Schottky-barrier photodiodes 1 have impurity-doped interfaces of the PtSi electrodes 13 and the Si substrate 4. If the interfaces are schematically distributed in the entire image area 20 as shown in FIG. 6, it is said that the doping concentrations of the interfaces are distributed concentrically with the center Y of the image area 20.

In an innermost circular area $A_1$, an n-type dopant such as arsenic (As) is doped most heavily, the doping concentration of which is $d_{n1}$. The same n-type dopant is doped in next three ring-shaped areas $A_2$, $A_3$ and $A_4$. The doping concentration $d_{n2}$ of the area $A_2$ is lower than the doping concentration $d_{n1}$ of the area $A_1$. The doping concentration $d_{n3}$ of the area $A_3$ is lower than the doping concentration $d_{n2}$ of the area $A_2$. The doping concentration $d_{n4}$ of the area $A_4$ is lower than the doping concentration $d_{n3}$ of the area $A_3$. In other words, the n-type doping concentration decreases in steps as the distance from the center Y increases, i.e., $d_{n1} > d_{n2} > d_{n3} > d_{n4}$.

No dopant is doped in a next ring-shaped area $A_5$.

A p-type dopant such as boron (B) is doped in a next ring-shaped area $A_6$, the doping concentration $d_{p6}$ of which is the lightest. The same p-type dopant is doped in the next six ring-shaped areas $A_7$, $A_8$, $A_9$, $A_{10}$, $A_{11}$ and $A_{12}$, the doping concentrations of which are $d_{p7}$, $dp_{p8}$, $d_{p9}$, $d_{p10}$, $d_{p11}$ and $d_{p12}$, respectively. The p-type doping concentration increases in steps as the distance from the center Y increases, i.e., $d_{p6} < d_{p7} < d_{p8} < d_{p9} < d_{p10} < d_{p11} < d_{p12}$.

The n- and p-type dopants are introduced into the interfaces of the PtSi electrode 13 and the Si substrate 4 by ion-implantation.

Due to the n- or p-type dopant, the effective Schottky-barrier height in each interface varies dependent on the doping concentration. The n-type dopant increases the effective Schottky-barrier height and the p-type dopant decreases the height.

Figure 8:
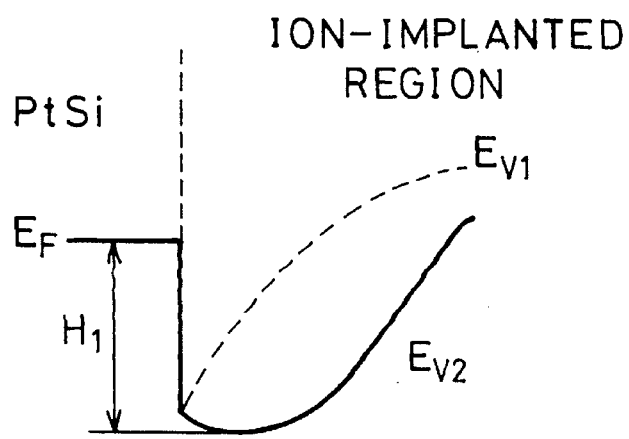
FIG. 8 is an energy band diagram in the vicinity of the interface of the PtSi film and the Si substrate, in which the interface is doped with an n-type impurity.
Figure 9:
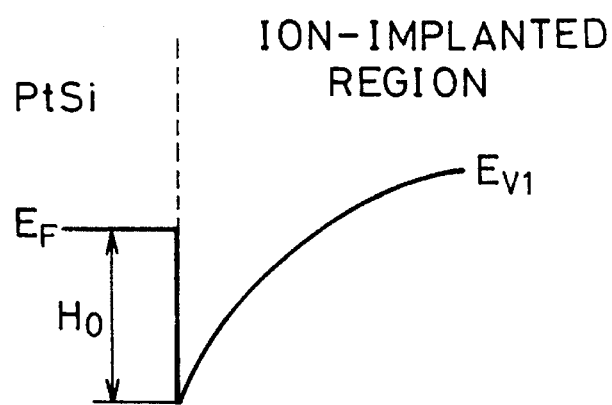
FIG. 9 is an energy band diagram in the vicinity of the interface of the PtSi film and the Si substrate, in which the interface is not doped with an impurity.
Figure 10:
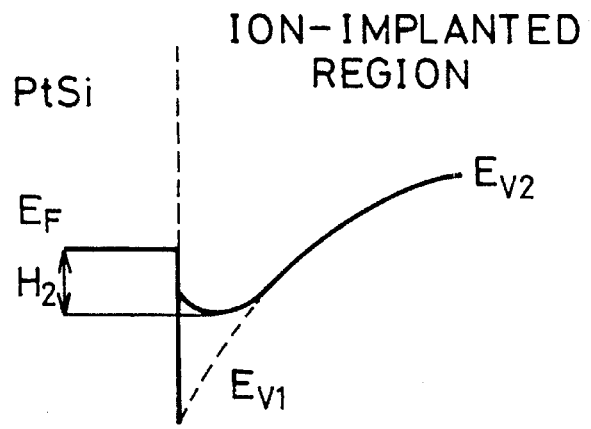
FIG. 10 is an energy band diagram in the vicinity of the interface of the PtSi film and the Si substrate, in which the interface is doped with a p-type impurity.

Specifically, the undoped, ring-shaped area $A_5$ has the effective Schottky-barrier height $H_0$, as shown in FIG. 9. On the other hand, the n-doped, ring shaped areas $A_1$ to $A_4$ each has the effective Schottky-barrier height $H_i$ higher than $H_0$, as shown in FIG. 8. The p-doped, ring-shaped areas $A_6$ to $A_{12}$ each has the effective Schottky-barrier height $H_2$ lower than $H_0$, as shown in FIG. 10.

Figure 7:
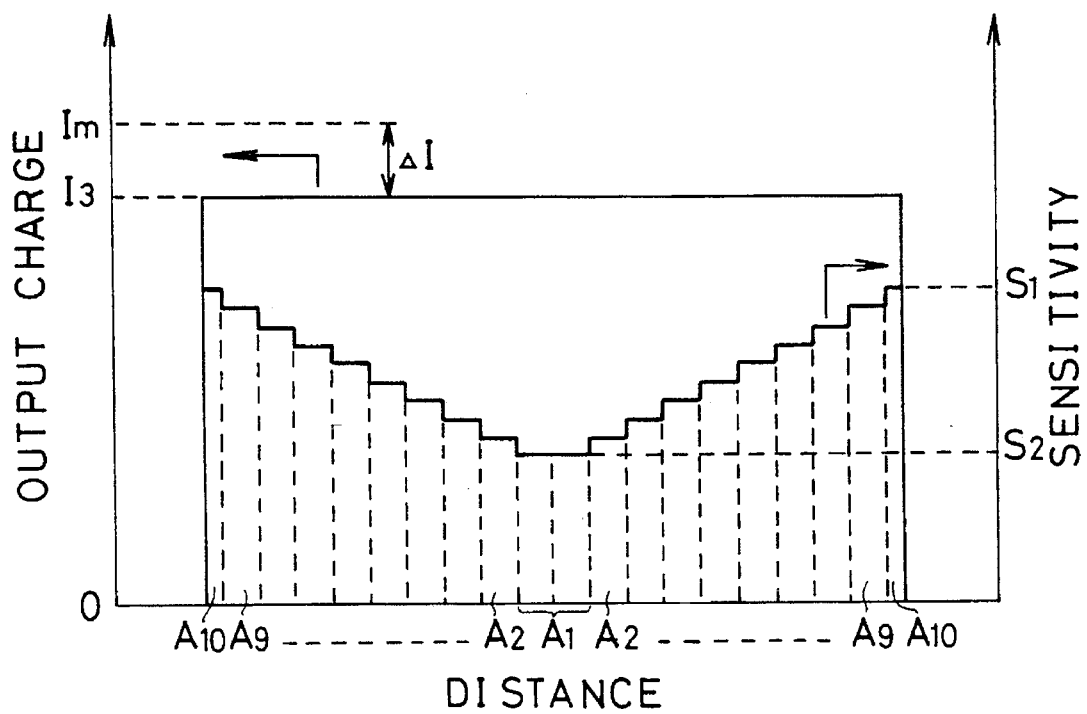
FIG. 7 is a graph showing output charge amount and sensitivity characteristics of the solid-state imaging device according to the embodiment as a function of a distance from an end of the image area.

Thus, the IR-light sensitivity of the areas $A_1$ to $A_{12}$ has the distribution that increases in steps from $S_2$ to $S_1$ as the distance from the center Y of the image area 20 increases, as shown in FIG. 7. In other words, the sensitivity of the photodiodes 1 is distributed concentrically with the center Y of the image area 20, and the sensitivity increases in steps dependent on the distance form the center Y. As a result, any nonuniformity of the incident light in the image area 20, which is generated by an optical system for introducing the incident light into the image area 20, can be cancelled. This means that a substantially constant output charge amount $I_3$ can be obtained in the overall image area 20, as shown in FIG. 7. Also, the output charge margin $\Delta I$ ($=I_m - I_3$) can be expanded.

As seen from FIG. 6, each picture cell 26 belongs to the different circular or ring-shaped areas. However, in practical use, the dopant type and doping concentration of each cell 26 are set to one type and one doping concentration, because the dopant distribution shown in FIG. 6 is very difficult or impossible for each cell 26 to be realized correctly.

For example, if a half or 50% of the cell 26 belongs to one of the areas $A_0$ to $A_{12}$, the dopant type and doping concentration of the entire cell 26 are the same as those of the area concerned.

In the case of the cell 26 disposed at a position B in FIG. 6, since a large part of this cell 26 belongs to the ring-shaped area $A_8$, the dopant type and doping concentration of this cell 26 are entirely set to be the same as those of the area $A_9$.

In general, although the IR-light sensitivity of the Schottky-barrier diode increases dependent on the reduction of the Schottky-barrier height, the thermally-created dark current and the bias current due to internal radiation from the optical system increase disadvantageously.

On the other hand, with the solid-state imaging device according to the embodiment, the bias current scarcely increases, because the photodiodes 1 having the increased sensitivity are arranged in the periphery of the image area 20 where the internal radiation is reduced. Therefore, no problem occurs.

Next, a fabrication method of the solid-state imaging device according to the embodiment is described below referring to FIGS. 11A to 11C.

First, as shown in FIG. 11A, the p-Si substrate 4 having the n-channel region 7 of the vertical transfer CCD 2 and the guard ring 8 for the photodiode 1 is prepared.

Next, after a patterned photoresist film 10 is formed on the substrate 4, a p-type dopant such as boron is selectively ion-implanted into the substrate 4 through a window of the film 10, forming the channel region 9 of the transfer gate device 3, as shown in FIG. 11A. To control the threshold voltage and the channel potential characteristic of the transfer gate device 3, the channel region 9 is then ion-implanted by another p-dopant.

After removing the photoresist film 10, a patterned photoresist film 12 is formed on the substrate 4. Then, to control the sensitivity of the photodiode 1, an n- and/or p-type dopant is selectively ion-implanted into the substrate 4, forming the region 16 of the photodiode 1, as shown in FIG. 11B. Thus, the sensitivity of the photodiodes 1 is defined as shown in FIG. 7. Here, n- and p-type dopants are implanted into the substrate 4, and this ion-implantation process is repeated twice for the both dopants.

Pt is selectively deposited on the ion-implanted region 16, forming the PtSi electrode 13 of the photodiode 1 due to reaction with Pt and Si.

Finally, the insulator film 17 containing the gate electrodes 14 and 15 therein is formed on the substrate 4, as shown in FIG. 11C, resulting in the solid-state image sensor of the embodiment.

Figure 12:
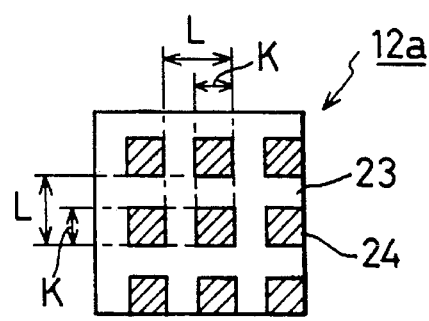
FIG. 12 is a partial plan view of a patterned resist mask used for the fabrication process shown in FIGS. 11A to 11C.

The photoresist film 12 used in the ion-implantation process of FIG. 11B has a window 12a disposed right above the region 16. As shown in FIG. 12, the window 12a is made of an opening 23 and a remaining resist material 24. The material 24 is patterned to be square in shape. The square shapes of the material 24 are arranged in a matrix array in the window 12a at the same pitch or spatial frequency L. The square shapes each have a side length K, where K<L.

For example, in consideration with the lateral expansion and the thermal diffusion relative to the photoresist film 12 in the above ion-implantation process, a preferable spatial frequency L is 1 μm or less. In this case, if the frequency L is 1 μm and the side length K is 0.5 μm, the area of each square is 0.25 μm², which is equivalent to 25% of the total area 1 μm² of the 1 μm×1 μm square. This means that 75% of the irradiated dopant ions are implanted into the substrate 4 through the window 12a.

A more preferable spatial frequency L is in the range from 0.5 μm to 0.2 μm. If L is equal to or smaller than 0.5 μm, the dopant ions can be implanted more uniformly. If L is smaller than 0.2 μm, such the resist film is difficult to be fabricated practically.

An obtainable sensitivity of the photodiode 1 changes dependent on the occupied area by the remaining resist material 24, because an obtainable doping concentration of the ion-implanted region 16 changes inversely proportional to the total area of the material 24. By changing the doping concentration of the region 16 in accordance with the position of the photodiode 1 or pixel in the image area 20, the desired sensitivity having the distribution of FIGS. 6 and 7 can be obtained easily.

As described above, with the solid-state imaging device of the embodiment, the sensitivity of the Schottky-barrier photodetectors 1 has a distribution that cancels nonuniformity of the incident light in the image area 20. Therefore, even if any nonuniformity of the incident light occurs in the image area 20 due to the shading phenomenon, the nonuniformity is cancelled by the distribution of the sensitivities of the photodetectors 1.

Also, the incident light is not reduced in intensity before the image area 20.

As a result, the shading phenomenon can be corrected effectively without overall sensitivity reduction of the solid-state imaging device.

Also, since the shading phenomenon is corrected without overall sensitivity reduction of the device, an imaging operation can be realized with a superior image quality and a wide dynamic range.

Figure 13:
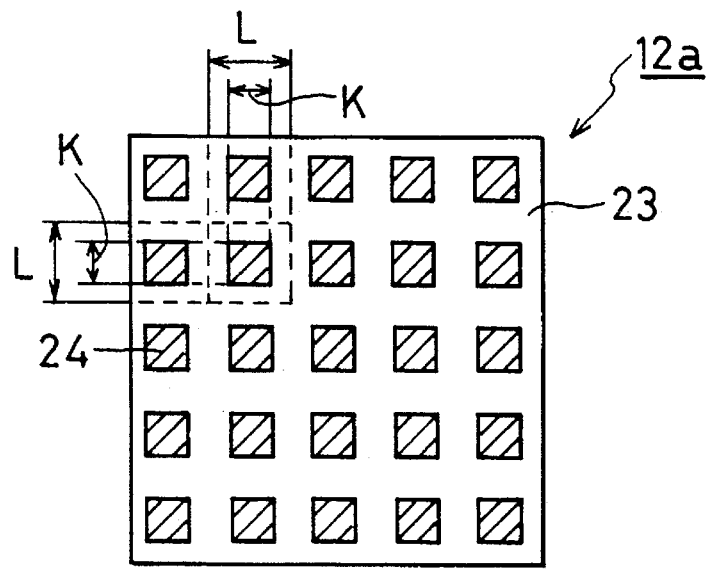
FIG. 13 is a partial plan view of another patterned resist mask used for the fabrication process shown in FIGS. 11A to 11C.
Figure 14:
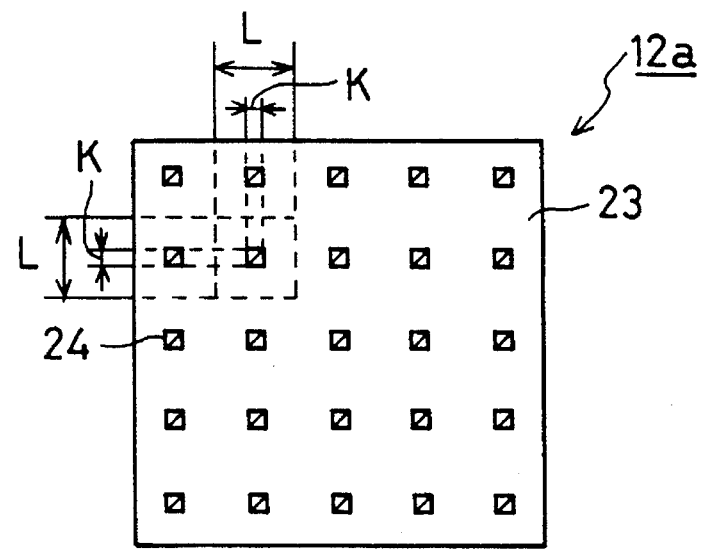
FIG. 14 is a partial plan view of still another patterned resist mask used for the fabrication process shown in FIGS. 11A to 11C.

FIGS. 13 and 14 shown variation of the window 12a of the photoresist film 12. In FIG. 13, if the frequency L is 1 μm, the side length $K_1$ is greater than 0.5 μm. This means that less than 75% of the irradiated dopant ions are implanted into the substrate 4 through the window 12a.

In FIG. 14, if the frequency L is 1 μm, the side length $K_1$ is less than 0.5 μm. This means that more than 75% of the irradiated dopant ions are implanted into the substrate 4 through the window 12a.

Figure 15:
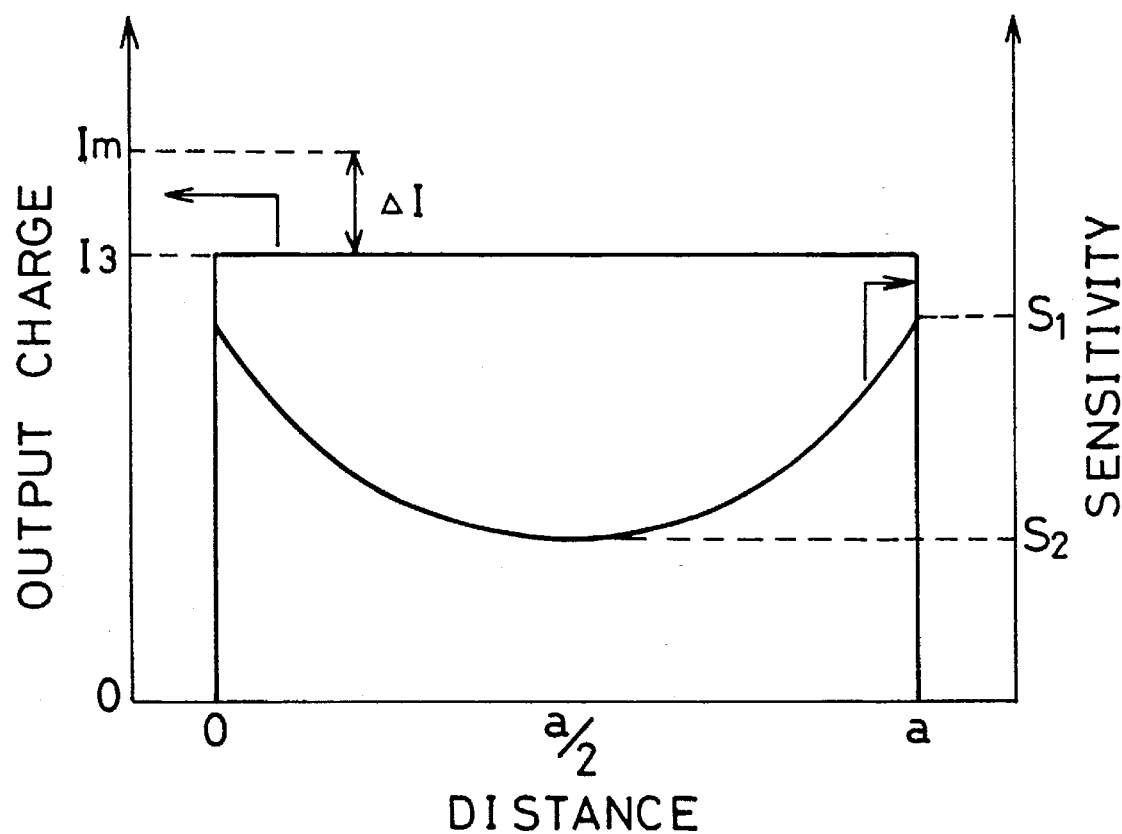
FIG. 15 is a graph showing output charge amount and sensitivity characteristics of a solid-state imaging device according to another embodiment of the invention.

FIG. 15 shows the output charge amount and sensitivity characteristics of a solid state imaging device according to another embodiment of the present invention.

In FIG. 15, the IR-light sensitivity of the photodiodes 1 has the distribution that increases continuously and monotonously from $S_2$ to $S_1$ as the distance from the center Y of the image area 20 increases. In other words, the sensitivity of the photodiodes 1 is continuously and increasingly distributed from the center Y of the image area 20 toward the periphery thereof.

The sensitivity distribution can be substantially obtained by narrowing the widths of the circular and ring-shaped areas $A_1$ to $A_{12}$ shown in FIGS. 6 and 7.

The solid-state imaging device of the above embodiment is of the interline transfer structure, however, the invention is not limited to this type and any other type of the device such as the frame transfer type may be applied.

Also, although the IR CCD image sensor is shown in the first embodiment, the invention may be applied to any other types of the image sensor. For example, in case of a visible light solid-state image sensor having p-n junction photodiodes, incident light entered through the n-type region of the junction tends to be absorbed at a portion where no electric field is applied. The absorption rate increases dependent on the doping concentration and the thickness of the n-type region, resulting in sensitivity reduction.

Further, though the two-dimensional solid-state imaging devices are described in the above embodiment, the invention can be realized as any type of one-dimensional devices.

In the above embodiments, both n- and p-type dopants are ion-implanted into the region 16 of the photodiode 1. However, it is sufficient that only one of n- and p-type dopants may be ion-implanted if a desired sensitivity distribution can be obtained. Also, both n- and p-type dopants may be doped into the same region 16 at different concentrations to produce a desired sensitivity of the photodiode 1.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A solid-state imaging device comprising:

a plurality of pixels arranged in an array, said plurality of pixels forming an image area of said imaging device;

a plurality of photodetectors for detecting incident light to generate signal charges;

a plurality of charge transfer devices for transferring said signal charges generated in said plurality of photodetectors;

each of said plurality of pixels containing one of said plurality of photodetectors and one of said plurality of charge transfer devices; and sensitivity of said plurality of photodetectors varies according to placement of said photodetectors in said image area;

wherein said sensitivity has a distribution that cancels nonuniformity of said incident light in said image area.

2. A solid-state imaging device as claimed in claim 1, wherein said sensitivity of said plurality of photodetectors is distributed concentrically with the center of said image area.

3. A solid-state imaging device as claimed in claim 2, wherein said sensitivity of said plurality of photodetectors is distributed to increase dependent on a distance from said center of said image area.

4. A solid-state imaging device as claimed in claim 1, wherein said plurality of photodetectors are Schottky-barrier photodiodes, each of said photodiodes having a metal electrode contacted with a semiconductor material;

and wherein an interface of said metal electrode and said semiconductor material is doped with an impurity, a doping concentration of said impurity varying according to placement of said photodetectors in said image area.

5. A solid-state imaging device as claimed in claim 4, wherein said doping concentration of said impurity varies concentrically with the center of said image area.

6. A solid-state imaging device as claimed in claim 5, wherein said doping concentration of said impurity varies to increase dependent on a distance from said center of said image area.

7. A solid-state imaging device as claimed in claim 4, wherein said interface of said metal electrode and said semiconductor material is doped with said impurity by selective ion-implantation.

8. A solid-state device comprising:

a plurality of pixels arranged in an array, said plurality of pixels forming an image area of said imaging device;

a plurality of Schottky-barrier photodiodes for detecting incident light to generate signal charges;

a plurality of charge transfer devices for transferring said signal charges generated in said plurality of photodiodes;

each of said plurality of pixels containing one of said plurality of photodiodes and one of said plurality of charge transfer devices; and Schottky-barrier heights of said plurality of photodiodes vary according to placement of said photodiodes in said image area;

wherein sensitivity of said plurality of photodiodes has a distribution that cancels nonuniformity of said incident light in said image area.

9. A solid-state imaging device as claimed in claim 8, wherein said sensitivity of said plurality of photodiodes is distributed concentrically with the center of said image area.

10. A solid-state imaging device as claimed in claim 9, wherein said sensitivity of said plurality of photodiodes is distributed to increase dependent on a distance from said center of said image area.

11. A solid-state imaging device as claimed in claim 8, wherein each of said plurality of photodiodes has a metal electrode contacted with a semiconductor material;

and wherein an interface of said metal electrode and said semiconductor material is doped with an impurity, a doping concentration of said impurity varying according to placement of said photodiodes in said image area.

12. A solid-state imaging device as claimed in claim 11, wherein said doping concentration of said impurity varies concentrically with the center of said image area.

13. A solid-state imaging device as claimed in claim 12, wherein said doping concentration of said impurity varies to increase dependent on a distance from said center of said image area.

14. A solid-state imaging device as claimed in claim 11, wherein said interface of said metal electrode and said semiconductor material is doped with said impurity by selective ion-implantation.

* * * * *